US008884614B2

(12) United States Patent
Wang et al.

(10) Patent No.: US 8,884,614 B2
(45) Date of Patent: Nov. 11, 2014

(54) EDDY CURRENT ARRAY PROBE (75) Inventors: Changting Wang, Niskayuna, NY (US); Yuri Alexeyevich Plotnikov, Niskayuna, NY (US); Mandar Diwakar Godbole, Bangalore (IN); Aparna Chakrapani Sheila-Vadde, Bangalore (IN)

(73) Assignee: General Electric Company, Niskayuna, NY (US)

(*) Notice: Subject to any disclaimer, the term of this patent is extended or adjusted under 35 U.S.C. 154(b) by 294 days.

(21) Appl. No.: 13/286,010

(22) Filed: Oct. 31, 2011

(65) Prior Publication Data

US 2013/0106409 A1 May 2, 2013

(51) Int. Cl.
*G01R 33/12* (2006.01)
*G01R 33/028* (2006.01)

(52) U.S. Cl.
CPC .................................. *G01R 33/028* (2013.01)
USPC ........... 324/239; 324/228; 324/229; 324/230; 324/231; 324/243

(58) Field of Classification Search
CPC ....... G01R 33/12; G01N 27/72; G01N 27/82; G01N 27/24; G01N 27/90
USPC .................................................. 324/228–243
See application file for complete search history.

(56) References Cited

U.S. PATENT DOCUMENTS

| | | | |
|---|---|---|---|
| 4,706,020 A | 11/1987 | Viertl et al. | |
| 5,006,800 A | 4/1991 | Hedengren et al. | |
| 5,182,513 A | 1/1993 | Young et al. | |
| 5,237,271 A | 8/1993 | Hedengren | |
| 5,262,722 A | 11/1993 | Hedengren et al. | |
| 5,315,234 A | 5/1994 | Sutton, Jr. et al. | |
| 5,345,514 A | 9/1994 | Mahdavieh et al. | |
| 5,371,461 A | 12/1994 | Hedengren | |
| 5,371,462 A | 12/1994 | Hedengren et al. | |
| 5,389,876 A | 2/1995 | Hedengren et al. | |
| 5,399,968 A | 3/1995 | Sheppard et al. | |
| 5,418,457 A | 5/1995 | Hedengren et al. | |
| 5,442,286 A | 8/1995 | Sutton, Jr. et al. | |
| 5,463,201 A | 10/1995 | Hedengren et al. | |
| 5,506,503 A * | 4/1996 | Cecco et al. | 324/220 |
| 5,510,709 A | 4/1996 | Hurley et al. | |
| 5,537,334 A | 7/1996 | Attaoui et al. | |

(Continued)

OTHER PUBLICATIONS

Obeid et al.,"Rotational GMR Magnetic Sensor Based Eddy Current Probes for Detecting Buried Corner Cracks at the Edge of Holes in Metallic Structures", IEEE SoutheastCon 2008, pp. 314-317, Apr. 3-6, 2008, Huntsville, Alabama.

*Primary Examiner* — Arleen M Vazquez
*Assistant Examiner* — Neel Shah
(74) *Attorney, Agent, or Firm* — Robert M. McCarthy (57) ABSTRACT

Present embodiments include eddy current array probes having differential coils capable of detecting both long and short flaws in a test specimen and, additionally or alternatively, multiplexed drive coils. For example, an eddy current array probe may include a first plurality of eddy current channels disposed in a first row and a second plurality of eddy current channels disposed in a second row. The first plurality and second plurality of eddy current channels overlap in a first direction but do not overlap in a second direction. The probe also includes a semi-circular drive coil disposed proximate to the first plurality and second plurality of eddy current channels and configured to generate a probing magnetic field for each sense coil of the eddy current channels.

6 Claims, 7 Drawing Sheets

(56) References Cited

U.S. PATENT DOCUMENTS

| | | |
|---|---|---|
| 5,629,621 A | 5/1997 | Goldfine et al. |
| 5,659,248 A | 8/1997 | Hedengren et al. |
| 5,737,445 A | 4/1998 | Oppenlander et al. |
| 5,793,206 A | 8/1998 | Goldfine et al. |
| 5,793,889 A | 8/1998 | Bushman |
| 5,801,532 A | 9/1998 | Patton et al. |
| 5,822,450 A | 10/1998 | Arakawa et al. |
| 5,835,223 A | 11/1998 | Zwemer et al. |
| 5,841,277 A | 11/1998 | Hedengren et al. |
| 5,903,147 A | 5/1999 | Granger, Jr. et al. |
| 5,966,011 A | 10/1999 | Goldfine et al. |
| 5,969,819 A | 10/1999 | Wang |
| 5,990,677 A | 11/1999 | Goldfine et al. |
| 6,144,206 A | 11/2000 | Goldfine et al. |
| 6,165,542 A | 12/2000 | Jaworowski et al. |
| 6,188,218 B1 | 2/2001 | Goldfine et al. |
| 6,198,279 B1 | 3/2001 | Goldfine |
| 6,252,393 B1 | 6/2001 | Hedengren |
| 6,252,398 B1 | 6/2001 | Goldfine et al. |
| 6,327,921 B1 | 12/2001 | Hsu et al. |
| 6,344,739 B1 | 2/2002 | Hardy et al. |
| 6,351,120 B2 | 2/2002 | Goldfine |
| 6,377,039 B1 | 4/2002 | Goldfine et al. |
| 6,380,747 B1 | 4/2002 | Goldfine et al. |
| 6,414,483 B1 | 7/2002 | Nath et al. |
| 6,420,867 B1 | 7/2002 | Goldfine et al. |
| 6,433,542 B2 | 8/2002 | Goldfine et al. |
| 6,486,673 B1 | 11/2002 | Goldfine et al. |
| 6,545,467 B1 | 4/2003 | Batzinger et al. |
| 6,608,478 B1 | 8/2003 | Dziech et al. |
| 6,670,808 B2 | 12/2003 | Nath et al. |
| 6,696,830 B2 | 2/2004 | Casarcia et al. |
| 6,888,347 B2 | 5/2005 | Batzinger et al. |
| 7,015,690 B2 * | 3/2006 | Wang et al. .................. 324/240 |
| 7,026,811 B2 | 4/2006 | Roney, Jr. et al. |
| 7,190,162 B2 | 3/2007 | Tenley et al. |
| 7,206,706 B2 | 4/2007 | Wang et al. |
| 7,233,867 B2 | 6/2007 | Pisupati et al. |
| 7,235,967 B2 | 6/2007 | Nishimizu et al. |
| 7,352,176 B1 * | 4/2008 | Roach et al. .................. 324/240 |
| 7,402,999 B2 * | 7/2008 | Plotnikov et al. ............. 324/220 |
| 7,589,526 B2 * | 9/2009 | Goldfine et al. .............. 324/240 |
| 7,759,831 B2 * | 7/2010 | Yagi ............................ 310/68 R |
| 2007/0222439 A1 * | 9/2007 | Wang et al. .................. 324/242 |
| 2010/0085045 A1 | 4/2010 | Sheila-Vadde et al. |

* cited by examiner

EDDY CURRENT ARRAY PROBE

BACKGROUND

Eddy current inspection is a technique that can be used to determine the presence of flaws, such as cracks, in conductive materials. Eddy current inspection utilizes electromagnetic induction, where a drive coil of an eddy current probe is placed proximate to a test specimen that is formed from conductive materials. The drive coil is energized via a current to create a magnetic field. The magnetic field induces eddy currents in the conductive materials of the test specimen, which generate a secondary magnetic field. The nature of the secondary magnetic field, such as its magnitude or directionality, at least partially depends on the structural features of the test specimen. For example, cracks, dents, or other structural irregularities may induce perturbations in the secondary magnetic field.

Sensing coils of the eddy current array probe, which are placed proximate to the test specimen, may sense these perturbations in the secondary magnetic field. The secondary magnetic field may induce a potential and/or a potential difference in the sensing coils, and the potential and/or potential difference may change depending on the perturbations generated by structural abnormalities. Specifically, the sensing coils generate signals relating to the change, and these signals are analyzed to detect flaws in the test specimen. Unfortunately, the ability of a typical eddy current probe to detect flaws via these potential changes is highly dependent on the orientation of the coils in the probe in relation to the orientation of the flaws, such as the orientation of a crack in the test specimen. Therefore, to ensure that most of the possible flaws of the test specimen are detected, the test specimen may be repeatedly scanned with the eddy current probe in different directions. These repeated scans may be time-consuming for a technician or similar personnel.

BRIEF DESCRIPTION

In one embodiment, an eddy current array probe is provided that includes a plurality of eddy current channels. Each eddy current channel has a first sense coil and a second sense coil, wherein the first and second sense coils are offset from one another in a first direction and a second direction, and the first and second sense coils overlap with one another in either or both of the first and second directions, and wherein the first and second sense coils are configured to be placed at opposite polarities. Each eddy current channel also includes a drive coil positioned proximate to the first and second sense coils, wherein the drive coil is configured to generate a probing magnetic field to induce an eddy current in a test specimen. The eddy current array probe also includes a conductive bus electrically coupled to the drive coil of each of the eddy current channels and configured to supply a current to the drive coil to generate the probing magnetic field. The conductive bus has an orientation that is substantially parallel with respect to a width of the eddy current array probe, and at least a portion of the eddy current channels have inclined orientations with respect to the conductive bus to enable the eddy current array probe to detect flaws having a length greater than a size of each of the eddy current channels.

In another embodiment, an eddy current array probe is provided that includes at least a first layer and a second layer, and an eddy current channel disposed on the first and second layers. The eddy current channel includes a drive coil disposed on the first layer and configured to generate a probing magnetic field in response to an applied current to induce an eddy current in a conductive material. The probe also includes a second layer disposed on the first layer, and a sensing coil disposed on the second layer in an area corresponding to a position of the drive coil on the first layer and configured to generate a signal in response to coupling with a secondary magnetic field generated by the eddy current in the surface conductive material. The sensing coil is an absolute coil or is one of a differential pair of sensing coils.

In a further embodiment, a system includes an eddy current array probe having a first plurality of eddy current channels disposed in a first row and a second plurality of eddy current channels disposed in a second row. The first plurality and second plurality of eddy current channels overlap in a first direction but do not overlap in a second direction. Each of the first plurality and second plurality of eddy current channels include at least one sense coil configured to generate a signal in response to a magnetic field generated by an eddy current in a surface of a conductive test specimen. The probe also includes a semi-circular drive coil disposed proximate to the first plurality and second plurality of eddy current channels and configured to generate a probing magnetic field for each sense coil in response to an applied current.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As noted above, the surfaces and/or interiors of test specimens may have flaws that are oriented in a number of directions, which may require a technician performing eddy current inspection to perform a large number of passes with an eddy current probe in different directions over the test specimen to ensure that all potential flaws are detected. Such testing techniques may be time-consuming and inefficient. Accordingly, the present disclosure provides embodiments for enabling an eddy current array probe (ECAP) to be sensitive to flaws, such as dents, cracks, or the like, in any orientation with respect to the probe. Accordingly, the time needed to perform eddy current inspection may be reduced. Furthermore, the present disclosure also provides embodiments for detecting long and short flaws using differential sensing coils, which are typically only able to detect short flaws in all orientations by an offset of another sense coil in a different row. For example, a short flaw may have a length that is less than the size of a sensing coil, and a long flaw may have a size that is approximately equal to or larger than the size of a sensing coil. For example, with a 5 mm probe, a short flaw may be 2 millimeters (mm) and a long flaw may be 10 mm. When a differential coil passing a long crack in a way that the two sense coils of the differential pair detect same response to the long crack, the differential coil produces zero output thus missing the detection.

For example, embodiments in accordance with the present disclosure may include differential sensing coils that are oriented in such a way so as to enable the ECAP to detect both long and short flaws. Additionally, drive coil configurations are provided that may be multiplexed and/or semi-circular so as to reduce crosstalk, reduce circuit complexity, and reduce sensitivity variation. For example, embodiments of drive coils are provided that may drive the adjacent channels at different time to reduce interference between eddy current channels (i.e., sets of drive coils and sensing coils) or avoid local drive current concentration (i.e., a "hot spot"), which causes a higher response to a defect than other location. Additionally or alternatively, drive coils in accordance with present embodiments may be disposed in separate layers from sensing coils, or may be twisted with sensing coils to reduce interference. Therefore, the present disclosure enables a higher signal-to-noise ratio for ECAP sensing coils, and also increases sensitivity of the same to structural flaws having a variety of orientations and lengths. Further, it should be noted that any of the approaches described herein may be used alone or in any combination.

Figure 1:
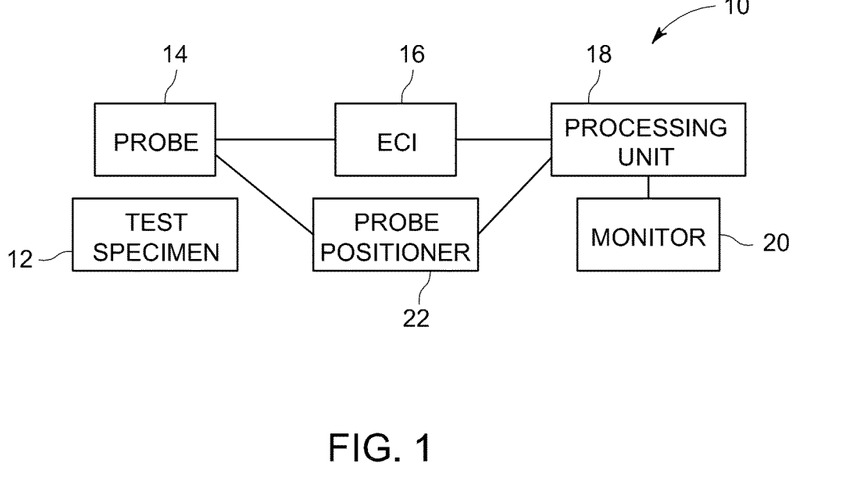
FIG. 1 is a block diagram of an embodiment of an eddy current inspection system, in accordance with an aspect of the present disclosure.

With the foregoing in mind, FIG. 1 illustrates a block diagram of an embodiment of a system 10 for performing non-destructive eddy current inspection of a test specimen 12. In a general sense, the test specimen 12 will be formed from, or may include parts that are formed from, one or more conductive materials. By way of example, the test specimen 12 may include parts that are used for energy capture or generation, such as parts of a turbine engine. Indeed, the present approaches enable the detection of structural defects in parts having non-regular (e.g., curved or toothed) surfaces, such as a turbine wheel.

Figure 2:
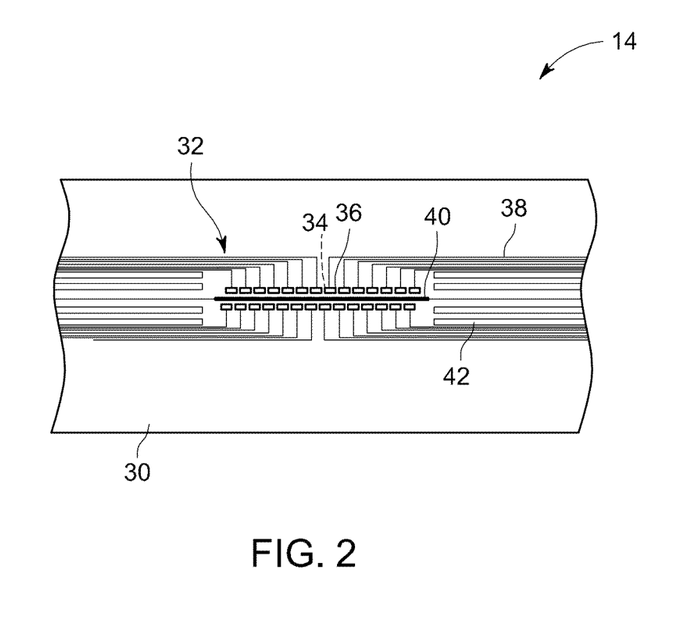
FIG. 2 is a cutaway view of an embodiment of an eddy current array probe, in accordance with an aspect of the present disclosure.

The system 10 includes an eddy current array probe (ECAP) 14, which may be a single-layer or multi-layer structure, as discussed in further detail below with respect to FIG. 2. In accordance with present embodiments, the ECAP 14 may include at least one drive coil and a plurality of sensing coils. The sensing coils may be configured to perform differential and/or absolute sensing, and may provide differential and/or absolute signals to an eddy current instrument (ECI) 16 configured to receive the signals. The ECI 16 may also generate signals that are provided to drive coils of the ECAP 14 for performing the eddy current inspection. Thus, in certain embodiments, the ECI 16 may act as a signal generator and data acquisition module.

The ECI 16 may include and, additionally or alternatively, may be operatively connected to, a processing unit 18. The processing unit 18 may be an application-specific or a general purpose computer having one or more processors. The processing unit 18 may be configured to access and perform one or more routines for performing eddy current inspection of the test specimen 12. For example, the processing unit 18 may analyze the differential and/or absolute signals collected by the probe 14 to determine the presence of structural defects in the test specimen 12. The results of such analysis, as well as any information pertinent to the analysis of the test specimen 12 may be visually displayed on a monitor 20, which may also be configured to provide user-perceivable indications or warnings as a crack or other deformation is detected.

The processing unit 18 may also be connected to a probe positioner 22. In certain embodiments, the probe positioner 22 may automatically, under the control of the processing unit 18, position the ECAP 14 at various points along a surface of the test specimen 12. Alternatively or additionally, the probe positioner 22 may position the ECAP 14 as a result of a user input. The probe positioner 22 may also provide feedback to the processing unit 18 to provide an indication of the position of the ECAP 14.

As noted above, the present approaches enable the detection of structural deformations in parts having non-regular (e.g., curved or toothed) surfaces, such as a turbine wheel. To enable the system 10 to perform such analyses, the ECAP 14 may be configured to conform to a variety of contours such that the ECAP 14 is capable of being positioned over a variety of test specimens. Furthermore, flexibility of the ECAP 14 may be desirable to enable efficient coupling of the probing magnetic field with the conductive surfaces of the test specimen 12, which generates the eddy currents that are monitored. As illustrated in FIG. 2, the ECAP 14 may include a main substrate 30 formed from a conforming material, such as a flexible polymeric material. Because the coils, which are conductive, will generally be disposed on the main substrate 30, the main substrate 30 may be a dielectric layer to prevent shorting and to provide electrical insulation. By way of example, the main substrate 30 may include one or more flexible polymeric layers, such as layers of insulating polyimide. In one embodiment, the main substrate 30 may include one or more layers of KAPTON® polyimide. The main substrate 30 may also be sized so as to allow conformance to surfaces of the test specimen 12. For example, a thickness of the main substrate 30 may range between approximately 25 and 200 microns.

A plurality of eddy current (EC) channels 32, which includes a plurality of drive coils 34 and a plurality of sensing coils 36, are formed on the main substrate 30. A plurality of conductors 38 are connected to the sensing coils 36 to enable the ECI 16 (FIG. 1) and/or the processing unit 18 (FIG. 1) to monitor the signals produced at the sensing coils 36. The ECAP 14 also includes one or more conductors 40 configured to carry a current to and from the drive coils 34 for the generation of the probing magnetic field. In accordance with an embodiment, the conductors 40 may be in the form of one or more bus structures to which a plurality of drive coils are connected. Shielding strips 42 may be disposed between various of the conductors 38, 40 to provide electromagnetic shielding for the conductors 38, 40 and to reduce cross talk.

The coils 34, 36, the conductors 38, 40, the shielding strips 42, and any electrical connections may be formed on the main substrate 30 using any suitable photolithographic techniques known in the art. Indeed, any one or a combination of conductive materials may be used in performing such techniques, such as copper, silver, gold, and the like. Furthermore, the ECAP 14 may include multiple layers formed by such techniques. For example, in certain configurations, it may be desirable to have a plurality, such as more than two, layers to enhance sensitivity. Accordingly, in certain embodiments, the present disclosure provides configurations in which the use of one or two flexible layers (e.g., less than three layers) are suitable for detecting surface deformations oriented in any direction and with sufficient signal-to-noise ratio. Thus, the ECAP 14 embodiments described herein may be configured to be omnidirectional probes. Approaches that enable a reduction in the number of layers suitable for an omnidirectional ECAP, such as ECAP 14, are described in detail below.

Figure 3:
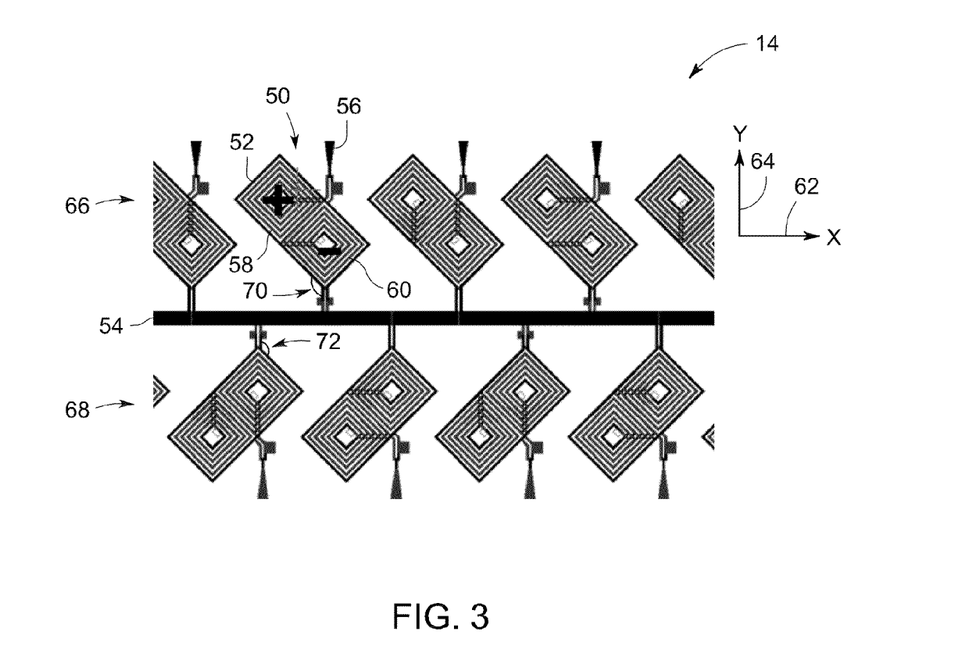
FIG. 3 is an expanded view of an embodiment of an eddy current array probe having a plurality of eddy current channels with respective differential sensing coil pairs, in accordance with an aspect of the present disclosure.

As noted above, the ECAP 14 may be configured to perform differential and/or absolute sensing. One embodiment of a differential configuration in accordance with present embodiments is illustrated in FIG. 3, which may represent an expanded view of a single drive of the ECAP 14. In FIG. 3, each of the EC channels 32 may include a differential pair 50 surrounded by a drive coil 52. As illustrated, the drive coils 52 are electrically coupled to a main bus 54, which is configured to carry current through the drive coils 52 for generating a probing magnetic field (i.e., the magnetic field that causes eddy currents in the electrically conductive surface of the test specimen 12). The differential pairs 50 are each coupled to an electrical connection 56, which is configured to provide an electrical interface between the differential pair 50 of sensing coils and the conductors 38 (FIG. 2) that carry sensing signals to monitoring equipment, such as ECI 16 and processing unit 18.

Each differential pair 50 includes a first sensing coil 58 and a second sensing coil 60, which are operatively connected via the electrical connection 56. The first and second sensing coils 58, 60, are of opposite polarities, which is represented as "+" and "−" in the illustrated embodiment, respectively. During operation of the ECAP 14 over a substrate having no cracks or other deformities, the responses generated by the first and second sensing coils 58, 60 cancel each other, such that signals carried away from each differential pair 50 have a voltage of approximately 0 volts (V). In other words, when no surface abnormalities are present, there is no voltage output by the differential pair 50. However, in embodiments where there is a surface imperfection, such as a crack, the secondary magnetic field generated by the eddy currents in the surface may deviate from its usual or expected orientation, which may cause the differential pair 50 to output a signal having a voltage that is analyzed by the ECI 16 or similar module. The deviation of the secondary magnetic field may depend on the orientation of the surface flaw, which may affect the magnitude and the polarity of the signal produced by the differential pair 50.

For example, in embodiments where the orientation of the flaw is aligned with the orientation of the first and second sensing coils 58, 60, the signals generated by the coils 58, 60 are substantially the same magnitude, but of opposite polarity. Accordingly, in such embodiments, the signals will cancel and the flaw may remain undetected by the ECAP 14. Thus, in accordance with present embodiments, the first and second sensing coils 58, 60 are offset in a first direction 62 (i.e., an x direction) and a second direction 64 (i.e., a y direction) and also partially overlap in the first and second directions 62, 64. This configuration enables the coils 58, 60 to complement coils in other rows, which are oriented orthogonally to the differential pair of the sensing coils 58, 60. It should be noted that the first and second directions 62, 64 may be generally oriented with reference to the length and height of the ECAP 14. Specifically, the first direction 62 may be substantially parallel with the length of the main substrate 30 (FIG. 2), and, additionally or alternatively, with respect to the bus 54. The second direction 64 may be substantially perpendicular with respect to the width of the main substrate 30 and, additionally or alternatively, with respect to the bus 54.

Each of the EC channels 50 may have an inclined orientation with respect to the bus 54 (i.e., the first direction 62). As defined herein, an inclined orientation denotes orientations greater than 0° but less than 90°. Thus, the EC channels 50 have orientations that are between 0° and 90°, exclusive, such as between approximately 5° and 85°, 10° and 80°, 20° and 70°, 30 and 60°, or approximately 45°. In the illustrated embodiment, the ECAP 14 includes a first row 66 of EC channels 50 and a second row 68 of complementary EC channels 50. The first row 66 includes EC channels 50 having a first inclined, angular orientation 70 with respect to the bus 54. In accordance with present embodiments, the first angular orientation 70 may be between approximately 5° and 85°, 10° and 80°, 20° and 70°, 30° and 60°, or 40° and 50°. Indeed, in one embodiment, the first angular orientation 70 may be approximately 45°. A second inclined, angular orientation 72 of the second row may be perpendicular to the first angular orientation. Further, the second angular orientation 72 of the EC channels 50 in the second row 68 may have substantially the same magnitude as the first angular orientation 70, but a different directionality. Indeed, the second angular orientation 72 may be between approximately 5° and 85°, 10° and 80°, 20° and 70°, 30° and 60°, or 40° and 50°, such as approximately 45° with respect to the bus 54 (i.e., the first direction 62). Such a configuration of the coils may enable channels of ECAP 14 to detect long cracks in addition to short cracks, rather than only detecting short cracks as in configurations where the two angular orientations are substantially the same. As noted above, long cracks or flaws may generally be noted as those having a length that is longer than a length traversing the differential sensing pair along its directional orientation with respect to the first direction 62.

While the embodiment illustrated in FIG. 3 depicts the differential pairs 50 as having a generally rectangular shape (i.e., each of the first and second sense coils 58, 60 are squares), it should be noted that other shapes may be possible as well. Moreover, while the orientations of the first and second rows 66, 68 may be the same in certain embodiments, in other embodiments, their respective orientations may be different. For example, differential pairs 50, and individually the first and second sense coils 58, 60 in certain embodiments, may be circular, semi-circular, diamond-shaped, or similar shapes, with varying orientations. For example, the first and second sense coils 58, 60 may each be triangles connected at their respective bases to form a diamond or square-shaped differential pair 50. Additionally, in certain embodiments, the drive and/or sensing coils described herein may traverse one or more layers of the ECAP 14, such that the drive and/or sensing coils are single coils disposed within one or more layers, as described below. Configurations in which the drive and/or sense coils traverse multiple layers may reduce interference between coils resulting from crosstalk, may reduce hot spots in the ECAP 14, and may increase sensitivity of the ECAP 14.

Figure 4:
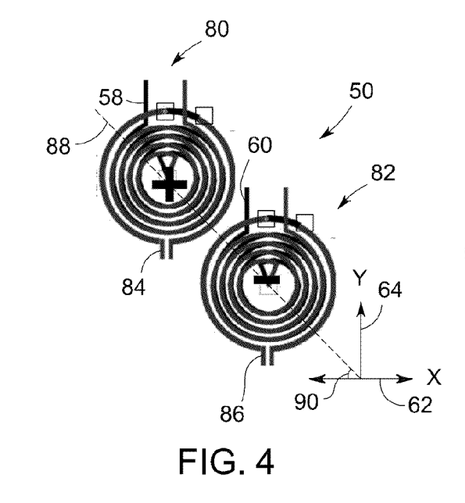
FIG. 4 is a top view of an embodiment of an eddy current channel having a dual layer drive coil-sensing coil differential pair, in accordance with an aspect of the present disclosure.

FIG. 4 illustrates one example embodiment wherein each of the first and second sense coils 58, 60 may be separate circular coils. As illustrated, the differential pair 50 includes a first drive-sense coil pair 80 and a second drive-sense coil pair 82. The first pair 80 includes the first sense coil 58 paired with a first drive coil 84, and the second pair 82 includes the second sense coil 60 paired with a second drive coil 86. As noted above, the drive and/or sense coils of the first and second pairs 80, 82 may be disposed within one or more layers of the ECAP 14. As illustrated, the first pair 80 is configured to output a signal at a positive polarity and the second pair 82 is configured to output a signal at a negative polarity, indicated as "+" and "−," respectively. The drive coil and sense coil for each pair 80, 82 may be disposed on different layers. For example, the sense coils 58, 60 may be disposed on a first layer (not shown), and the drive coils 84, 86 may be disposed on a second layer (not shown). As discussed herein, such a configuration may be denoted as having an external drive configuration.

In FIG. 4, the first sensing coil 58 and second sensing coil 60 are separate coils, and may be connected or coupled using an electrical connection similar to the electrical connections 56 depicted in FIG. 3. In a similar manner to the differential pairs 50 discussed with respect to FIG. 3, the first and second sensing coils 58, 60 are offset from one another in the first and second directions 62, 64. Indeed, the degree of offset in each of the directions 62, 64 may affect the ability of the differential pair 50 to detect short and long flaws. Thus, in accordance with an embodiment, the first and second pairs 80, 82 may be oriented such that a line 88 connecting the center of each of the pairs 80, 82 is offset from the first direction 62 (i.e., with respect to a length of the ECAP 14) at an angular orientation 90 of approximately 45°, such as between approximately 20° and 70°, 30° and 60°, or 40° and 50°.

Additionally or alternatively, the differential pair 50 may include a configuration where the first and second sensing coils 58, 60 are semicircular such that the differential pair 50 forms a circle. Such a configuration is illustrated with respect to FIG. 5. In the differential pair 50 embodiment of FIG. 5, the first sensing coil 58 and the second sensing coil 60 are each semicircular coils that may be disposed in one or more layers of the ECAP 14. The first and second sensing coils 58, 60 are both surrounded by a single loop drive coil 96, which may also be disposed on a single layer of the ECAP 14, or may traverse two or more layers.

Figure 5:
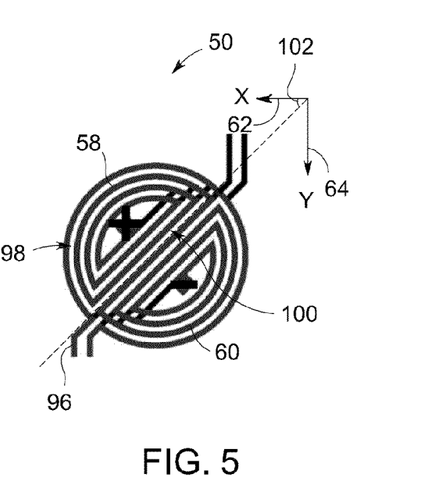
FIG. 5 is a top view of an embodiment of an eddy current channel having a semi-circular sensing coil differential pair disposed within a single loop drive coil, in accordance with an aspect of the present disclosure.

Each of the first and second sensing coils 58, 60 include a respective curved or arcuate portion 98, and a substantially straight portion 100. The first and second sensing coils 58, 60 are offset with respect to one another in the first and second directions 62, 64, and also overlap in both directions 62, 64. Further, the first and second sensing coils 58, 60 are oriented with respect to one another such that their respective straight portions 100 have an angular orientation 102 that is approximately 45° with respect to the first direction 62, such as between approximately 20 and 70°, 30 and 60°, or 40 and 50°. Again, the first and second sensing coils 58, 60 may complement differential pairs having orthogonal orientations in other rows, and this configuration enables the differential pair 50 to detect flaws having any orientation, and also enables the detection of both short and long flaws (e.g., cracks).

Figure 6:
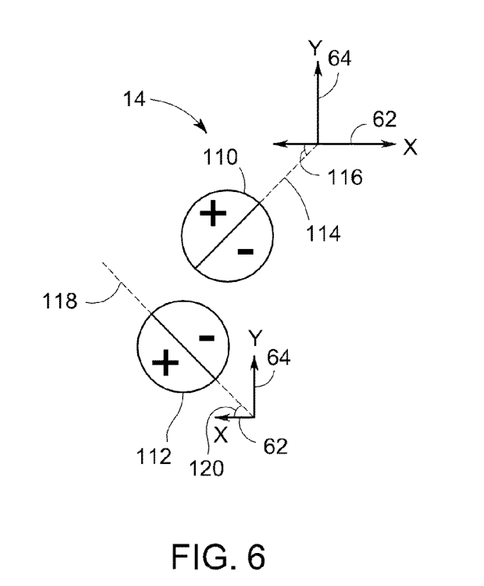
FIG. 6 is a diagrammatical representation of an embodiment of the relative orientation of a first differential pair and a second differential pair, in accordance with an aspect of the present disclosure.
Figure 7:
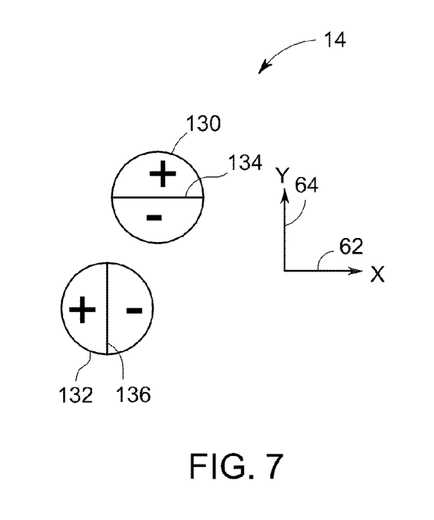
FIG. 7 is a diagrammatical representation of an embodiment of the relative orientation of a first differential pair and a second differential pair, in accordance with an aspect of the present disclosure.

As noted above, in addition to the orientation of each differential pair 50, the relative orientation of differential pairs 50, for example those in the first row 66 relative to those in the second row 88 of FIG. 3, may facilitate detection of long and short flaws having any orientation. In accordance with present embodiments, the differential pairs 50 in differing rows may have the same, or different orientations. Therefore, any number of orientations for the differential pairs 50 may be possible, such as those where the differential pairs are substantially aligned with the first direction 62, substantially perpendicular with respect to the first direction 62, or any angle therebetween. For example, FIGS. 6 and 7 each illustrate example embodiments of the respective orientations of differential pairs 50. The differential pairs illustrated in FIGS. 6 and 7 are depicted as circles for simplicity. However, it should be noted that any configuration of the sense coils may be employed in the present embodiments. For example, the sense coils of the differential pairs in FIGS. 6 and 7 may have circular, semi-circular, square, rectangular, triangular, or any geometric configuration. Further, any combination of configurations is also presently contemplated.

Specifically, FIG. 6 depicts a first differential pair 110 and a second differential pair 112. The differential pairs 110, 112 each have a pair of sensing coils placed at opposite polarities, denoted as "+" and "−." As illustrated, the first differential pair 110 has an overall orientation, depicted as a line 114, that has an angle 116 of approximately 45° with respect to the first direction 62. Similarly, the second differential pair 112 has an overall orientation, depicted as a line 118, that has an angle 120 of approximately −45° with respect to the first direction 62. As in FIG. 3, the orientations of the first and second differential pairs 110, 112 are such that their signals do not always cancel for cracks of any size and direction.

FIG. 7 illustrates an embodiment of a first differential pair 130 and a second differential pair 132 having orthogonal orientations. Specifically, in the illustrated embodiment, the first differential pair 130 has a first orientation that is orthogonal to a line 134 bisecting the pair 130, the line 134 being substantially aligned with respect to the first direction 62, and substantially perpendicular with the second direction 64. On the other hand, the second differential pair 130 has an orientation that is orthogonal to a line 136 bisecting the pair 132, the line 136 being substantially perpendicular with the first direction 62 and substantially aligned with the second direction 64.

The orientation of the first differential pair 130 is configured such that the first pair may be sensitive to long flaws having an orientation that is angled with respect to the second direction 64, including flaws that are substantially aligned with the first direction 62. However, the first differential pair 130 may not be sensitive to, or may have low sensitivity to, long flaws having an orientation that is substantially aligned with the second direction 64. Conversely, the second differential pair 132 may be able to detect long flaws having an orientation that is substantially aligned with the second direction 64, and angled with respect to the first direction 62.

However, the second differential pair 132 may have a limited sensitivity to long flaws having an orientation that is substantially aligned with the second direction 64. Accordingly, the first and second differential pairs 130 and 132 are complementary, such that flaws that may not be detected by one of the pairs are detected by the other pair.

Figure 8:
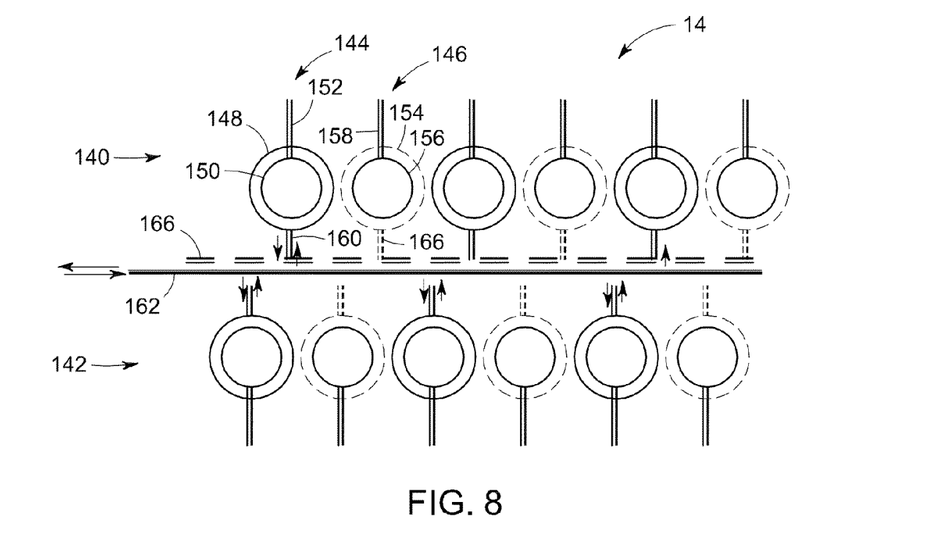
FIG. 8 is an expanded view of an embodiment of an eddy current array probe having a plurality of eddy current channels driven by dual-layer interleaved drive coils, in accordance with an aspect of the present disclosure.

The present embodiments also provide, in addition to or in lieu of the sensing coil configurations described above, various drive coil configurations that are adapted to reduce interference and hot spots in the ECAP 14. FIG. 8 depicts an expanded view of the ECAP 14 showing a first row of EC channels 140 and a second row of EC channels 142 having portions that are interleaved across two or more layers of the ECAP 14. In the present embodiment, the first and second rows of EC channels 140, 142 each include first and second EC channels 144, 146, which are disposed in different layers. Each of the first EC channels 144 includes a first drive coil 148 disposed on a first layer of the ECAP 14 (e.g., a bottom layer) and a first sense coil 150 disposed on the first and a second layer of the ECAP 14 (e.g., the bottom and a top layer). The first sense coil 150 has a first electrical connection 152 that leads to either layer of the ECAP 14. Conversely, the second EC channel 146 includes a second drive coil 154 on the second layer (e.g., the top layer), illustrated as dashed lines, and a second sense coil 156 having a second electrical connection 158 that leads to either layer. While the sensing coils 150, 156 are depicted as circles for simplicity, it should be noted that any shape or configuration for absolute and/or differential pairs are presently contemplated. Thus, the sensing coils 150, 156 may be circular, semi-circular, rectangular, square, triangular or any other geometrical shape.

The first drive coils 148 of the first EC channels 144 are each connected via a conductor 160 to a first bus 162 disposed on the first layer (e.g., the bottom layer) of the ECAP 14. The first bus 162 is configured to deliver a current to the first driver coil 148 of each of the first EC channels 144. Each of the second drive coils 154, which are disposed in the second layer of the ECAP 14, are coupled via second conductors 164 to a second bus 166 configured to provide a current. The second bus 166 is disposed on the second layer, represented as dashed lines. Therefore, the first bus 162 is disposed on a first layer of the ECAP 14 and the second bus 166 is disposed on a second layer of the ECAP 14. Such a configuration enables the separation of current flowing through the buses 162, 166 for adjacent EC channels, which reduces interference and hot spots.

Figure 9:
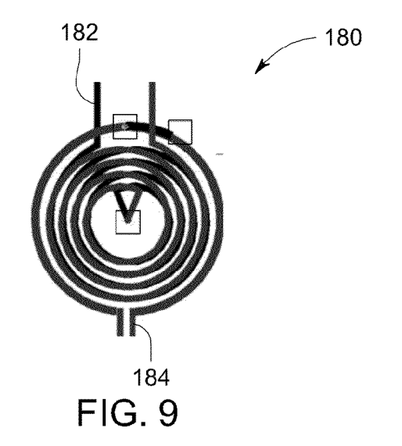
FIG. 9 is a top view of an embodiment of an absolute sensing coil having an external drive design, in accordance with an aspect of the present disclosure.
Figure 10:
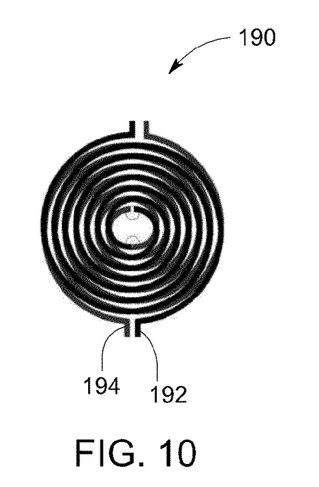
FIG. 10 is a top view of an embodiment of an absolute sensing coil-drive coil twisted pair, in accordance with an aspect of the present disclosure.

While the embodiment illustrated in FIG. 8 depicts each of the sensing coils as being surrounded by a drive coil. However, other configurations for absolute sensing coils are also presently contemplated. FIGS. 9 and 10 depict examples of absolute sensing coil-drive coil configurations. Specifically, FIG. 9 illustrates an external drive configuration for a sensing coil-drive coil pair 180, where an absolute sensing coil 182 is disposed inside a drive coil 184, and traverses two or more layers of the ECAP 14. For example, the sensing coil 182 may be disposed on any combination of a top, bottom, and middle layer of the ECAP 14. The drive coil 184, however, may be disposed only on a single layer or multiple layers. Thus, the drive coil 184 may be positioned at least partially external to the sensing coil 182, which may reduce interference and crosstalk.

FIG. 10 illustrates an embodiment of a twisted drive and receive pair 190, which includes a sensing coil 192 interleaved with a drive coil 194. Specifically, the sensing coil 192 and drive coil 194 each include portions positioned within a first layer and other portions positioned within a second layer of the ECAP 14. The sensing coil 192 and the drive coil 194 interleave with each other between the first and second layers of the ECAP 14, which effectively twists the sensing coil 192 with the drive coil 194. Thus, the sensing coil 192 and the drive coil 194 each include a coil winding, rather than a single loop.

Figure 11:
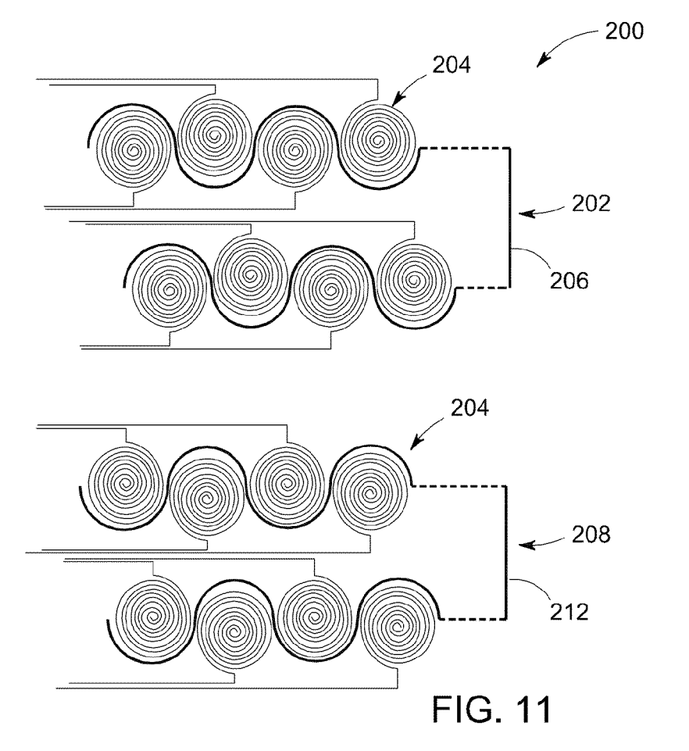
FIG. 11 is a separated view of a dual-layer eddy current array probe having multiplexed semi-circular drive coils, in accordance with an aspect of the present disclosure.

In addition to or in lieu of the approaches described above, interference and crosstalk between EC channels may be reduced by multiplexing the drive coils or using different frequencies in the different drive coils used to generate the probing magnetic field. Such embodiments are described in detail below with respect to FIGS. 11, 12, and 14. For example, two or more drive coils may be multiplexed across two or more layers of the ECAP 14, which may also reduce the number of coils and simplify the circuitry for the ECAP 14. An embodiment of a two-layer configuration 200 is illustrated in FIG. 11. The two-layer configuration 200 includes a first layer configuration 202 having a plurality of absolute sensing coils 204 surrounded by a first semi-circular drive coil 206, and a second layer configuration 208 having the absolute sensing coils 204 surrounded by a second semi-circular drive coil 212.

In accordance with an embodiment, the first layer configuration 202 may be stacked over or under the second layer configuration 208. The first and second semi-circular drive coils 206, 212 may interleave with one another across the first and second layers of the ECAP 14. Further, the first and second semi-circular drive coils 206, 212 may be complementary to form single loop drive coils over each of the EC channels (i.e., over each of the sensing coils). Multiplexing the first and second semi-circular drive coils 206, 212 in this way may reduce interference, reduce hot spots, and may reduce crosstalk.

Figure 12:
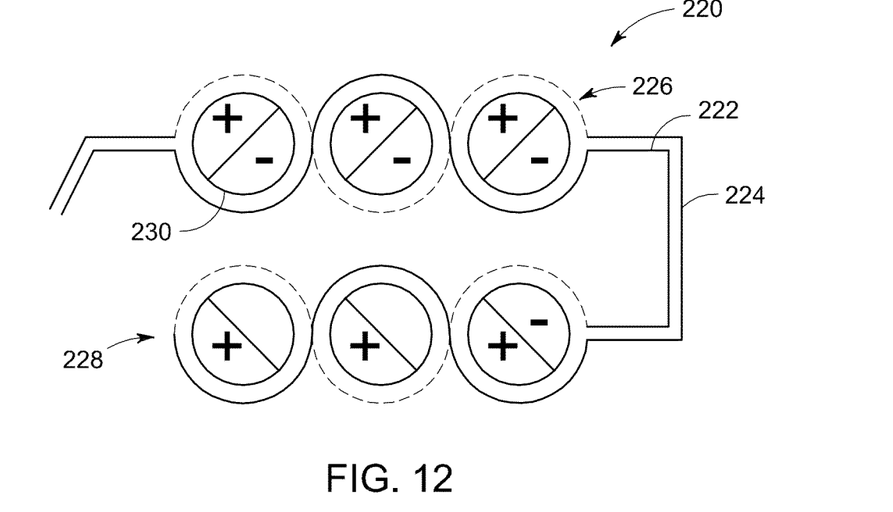
FIG. 12 is a diagrammatical representation of a dual-layer eddy current array probe having multiplexed semi-circular drive coils disposed about a plurality of differential sensing coil pairs, in accordance with an aspect of the present disclosure.

The embodiment illustrated in FIG. 11 may also be applicable to configurations in which the sensing coils are differential pairs, as illustrated in FIG. 12. In FIG. 12, a drive-multiplexed dual layer configuration 220 includes a first semi-circular drive coil 222 and a second semi-circular drive coil 224 each disposed about a first and second row of differential sensing coil pairs 226, 228. As illustrated, each differential sensing coil pair 230 has an orientation that is approximately 45° with respect to the first direction 62. Accordingly, in certain embodiments, the sensing coils described herein have the ability to detect both long and short cracks, and have omnidirectional sensitivity.

The first semi-circular drive coil 222 is illustrated as being positioned within first and second layers of the ECAP 14, which are illustrated as solid and dashed lines, respectively. That is, the first semi-circular drive coil 222 is disposed in a first layer of the ECAP 14 at an area proximate to the first row of differential pairs 226, and is disposed in a second layer of the ECAP 14 at an area proximate to the second row of differential pairs 228. Conversely, second semi-circular drive coil 224 is illustrated as being positioned within first and second layers of the ECAP 14, which is illustrated as dashed and solid lines, respectively. The second semi-circular drive coil 224 is disposed in a first layer of the ECAP 14 at an area proximate to the second row of differential pairs 228, and is disposed in a second layer of the ECAP 14 at an area proximate to the first row of differential pairs 226. In other words, the first and second semi-circular drive coils 222, 224 are disposed within different layers for each channel. Multiplexing the drive coils in this way reduces the complexity of the ECAP circuitry, reduces interference, and also may reduce or eliminate crosstalk between EC channels.

The approaches described above include multiplexed semi-circular drive coils, which may reduce crosstalk between EC channels and may reduce hot spots in the ECAP 14. In other embodiments, however, it may be desirable to use a drive coil disposed in a single layer. Accordingly, the present disclosure also provides embodiments in which a semi-circular drive coil is configured for use in a single layer, while simultaneously enabling the ECAP 14 to detect flaws in any direction.

Figure 13:
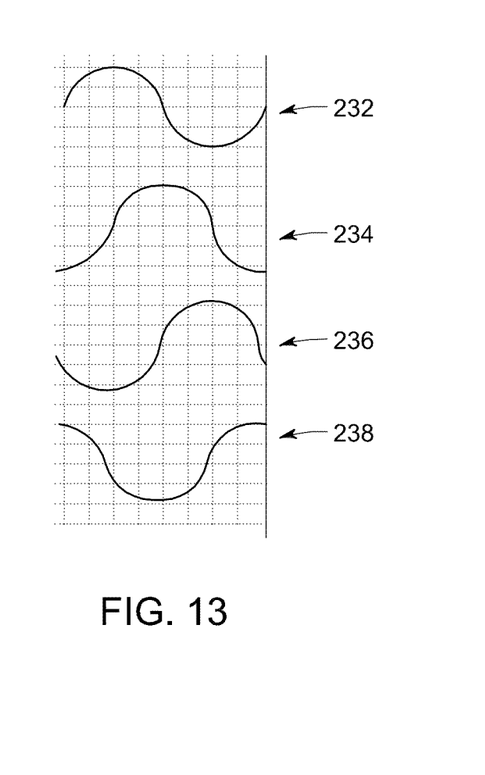
FIG. 13 is a diagrammatical representation of a configuration of multiple semi-circular drive coils, in accordance with an aspect of the present disclosure.

In accordance with certain embodiments, the semi-circular single layer drive coils described herein may include a series of spatial and complementary relationships across two or more rows. For example, as illustrated in FIG. 13, certain embodiments of the semi-circular drive coils may have the drive coils in different rows to be offset from the previous row by 90 degrees (such that it is similar to a series of complementary sinusoidal and cosinusoidal shapes), which are illustrated as first, second, third, and fourth shapes 232, 234, 236, and 238. Shapes 232, 234, 236, and 238 can be partially interconnected or partially multiplexed. As illustrated, the first and third shapes 232 and 236 are complementary sinusoidal shapes such that when they are superimposed, they form circular loops. Similarly, the second and fourth shapes 234, 238 are complementary cosinusodal shapes such that when they are superimposed, they form circular loops. As discussed herein, the first and second shapes 232, 234, when used in combination, enable the ECAP 14 to detect radial and circumferential flaws (i.e., 0 and 90° with respect to the first direction 62). The third and fourth shapes 236, 238 also have this relationship.

In a similar manner, the first and third shapes 232, 236, when used in combination, enable the ECAP 14 to detect flaws having a diagonal (i.e., +45 and −45° with respect to the first direction 62). The second and fourth shapes 234, 238 also have this relationship. Thus, when used in combination, the first through fourth shapes 232-238 enable omnidirectional sensitivity to flaws. It should be noted that these shapes may be used along a series of rows, as depicted with respect to FIG. 14. That is, three rows offset from each other by 90 degrees may be sufficient to achieve omnidirectional sensitivity.

Figure 14:
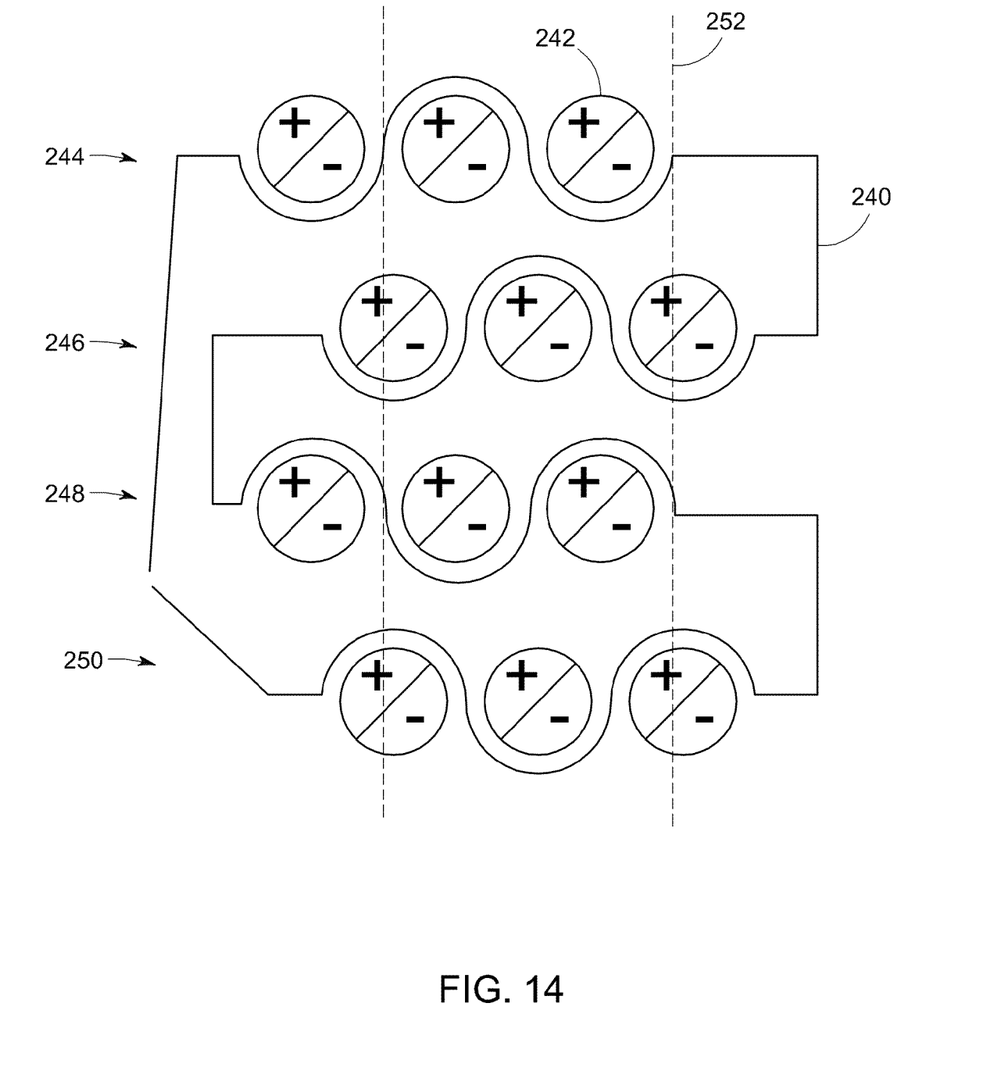
FIG. 14 is a diagrammatical representation of a single layer semi-circular drive coil disposed about four rows of differential sensing coil pairs, in accordance with an aspect of the present disclosure.

FIG. 14 depicts an embodiment of a semi-circular drive 240 is illustrated as disposed proximate to a plurality of differential pairs 242 of sensing coils. Specifically, the semi-circular drive 240 is disposed proximate to a first row 244, a second row 246, a third row 248, and a fourth row 250 of differential pairs of sensing coils. In accordance with present embodiments, the drive coil 240 includes the first, second, third, and fourth shapes 232, 234, 236, 238 discussed above with respect to FIG. 13. Thus, the drive coil 240 enables the ECAP 14 to have omnidirectional sensing capability. More specifically, the shape of the drive coil 240 in row combinations corresponds with an ability to detect flaws having certain orientations.

As will be appreciated with reference to FIG. 14, the shape of the drive coil 240 at the first row 244 is complementary with the shape of the drive coil 240 at the third row 248 (i.e., complementary sinusoidal shapes), and the shape of the drive coil 240 at the second row 246 is complementary with the shape of the drive coil 240 at the fourth row 250 (i.e., complementary cosinusoidal shapes), as may be appreciated with reference to the spatial relationship between lines 252. For example, a combination of the shape of the drive coil 240 in the first and second rows 244, 246 may enable the detection of flaws having an orientation that is radial or circumferential (i.e., 0 or 90° with respect to the first direction 62). A combination of the shape of the drive coil in the third and fourth rows 248, 250 may also provide this capability.

In another example, a combination of the shape of the drive coil 240 in the first and third rows 244, 248 may enable the detection of flaws that are oriented approximately 45° with respect to the first direction 62 (i.e., +45° and −45°). A combination of the shape of the drive coil in the second and fourth rows 246, 250 may also provide this capability. Accordingly, a combination of all of the shapes of the drive coil 240 in the first through fourth rows 244-250 enables omnidirectional sensitivity to flaws in the test specimen 12. It should be noted that while the embodiment illustrated in FIG. 14 includes four rows, that other numbers of rows may be utilized, such as three rows, or more than four rows. For example, in embodiments where the semi-circular drive coil has three rows, the rows may be offset by approximately 90° from one another to enable omnidirectional sensitivity. However, the use of two rows may be sufficient for detecting radial and circumferential flaws.

As discussed above, multiple rows of sensing coils complement each other to provide different coverage over the surface of the ECAP 14. For example, sensing coils within each row may overlap with sensing coils in an adjacent row in the first direction 62 but not in the second direction 64. The overlap may be between 0 and 100%, such as between approximately 10% and 100%, 20% and 100%, 30% and 95%, 40% and 90%, or 50% and 85%. Example embodiments of such overlapping are described below with respect to FIGS. 15 and 16.

Figure 15:
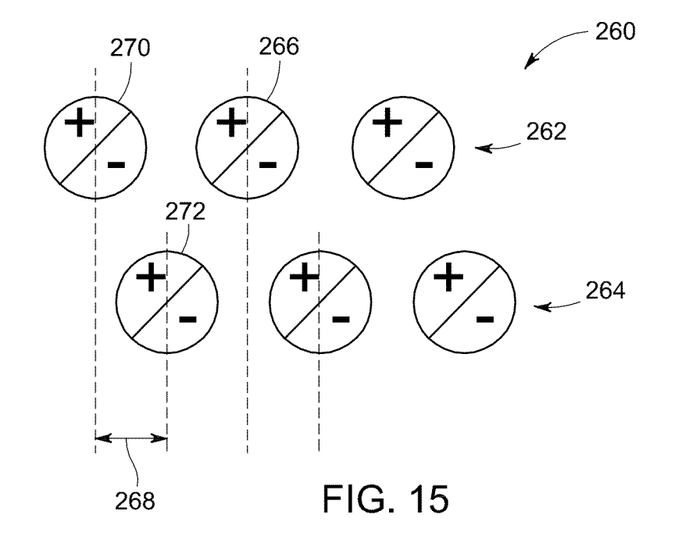
FIG. 15 is a diagrammatical representation of two rows of differential sensing coil pairs that overlap in a first direction, in accordance with an aspect of the present disclosure.

FIG. 15 depicts an embodiment of an ECAP sensing coil configuration 260 having a first row 262 and a second row 264 of differential pairs 266. The differential pairs 266 may overlap in the first direction 62 by an extent that enables coverage sufficient to eliminate dead areas in the ECAP 14 (i.e., regions where the ECAP 14 is unable to detect a flaw). It should be noted that in certain embodiments, the distance between adjacent differential pairs 266 within the same row may be fixed. Accordingly, shifting each row relative to the other may modify the overlap between adjacent sensing coils in different rows. For example, in FIG. 15, the overlap between adjacent differential pairs 266 in different rows may be referenced by a distance 268 between their respective centers. For example, the distance 268 between the center of a first differential pair 270 and the center of a second differential pair 272 may provide an indication as to the extent of overlap. In the illustrated embodiment, the distance 258 is greater than 50% of each pair 270, 272. Accordingly, the overlap between the pairs 270, 272 may be less than 50%, such as between approximately 10% and 50%, 20% and 45%, or approximately 40%. It should be noted that while greater overlap may be desirable in certain situations, a certain offset may also be desirable to avoid channel counts in the ECAP 14.

Figure 16:
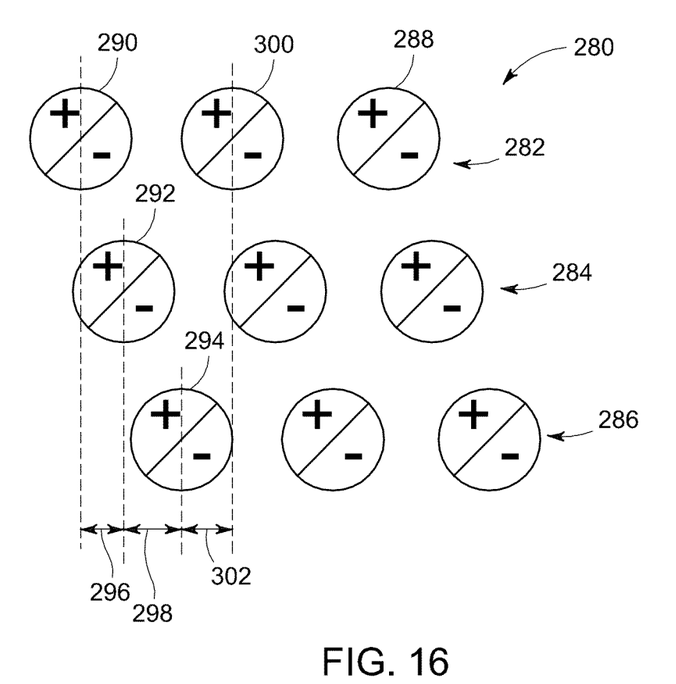
FIG. 16 is a diagrammatical representation of three rows of differential sensing coil pairs that overlap in a first direction, in accordance with an aspect of the present disclosure.

A greater degree of overlap may be possible with a greater number of rows, as depicted in FIG. 16. In FIG. 16, an embodiment of an ECAP sensing coil configuration 280 having first, second, and third rows 282, 284, 286 of differential pairs 288 is illustrated. As in FIG. 15, the differential pairs 288 in adjacent rows overlap in the first direction 62. For example, a first differential pair 290 in the first row 282 overlaps with a second differential pair 292 in the second row 284 and a third differential pair 294 in the third row 286. The degree of overlap between the first and second differential pairs 290, 292, which is referenced by a distance 296 between their respective centers, is less than 50% of the width of each of the pairs. Accordingly, the overlap between the pairs 290, 292 is greater than 50%, such as between 50% and 100%, 55% and 95%, or approximately 60%. A distance 298 between the centers of the second differential pair 292 and the third differential pair 294 may be less than or substantially equal to the distance 296. Similarly, a distance 302 between the third differential pair 294 and a fourth differential pair 300, which is located directly adjacent to the first differential pair 290 in the first row 282, may be less than or equal to the distance 296. Indeed, the relatively high degree of overlap between the differential pairs 288 of the first, second, and third rows 282, 284, 286 may enable the ECAP 14 to have omnidirectional sensitivity, and may reduce or eliminate areas of low sensitivity to flaws.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. An eddy current array probe, comprising:
 a plurality of eddy current channels, each eddy current channel comprising:
  a first sense coil and a second sense coil, wherein the first and second sense coils are offset from one another in a first direction and a second direction, and the first and second sense coils overlap with one another in either or both of the first and second directions, and wherein the first and second sense coils are configured to be connected at opposite polarities;
  a drive coil positioned proximate to the first and second sense coils, wherein the drive coil is configured to generate a probing magnetic field to induce eddy currents in a conductive material; and
 a conductive bus electrically coupled to the drive coil of each of the eddy current channels and configured to supply a current to the drive coil to generate the probing magnetic field, the conductive bus comprises an orientation that is substantially parallel with respect to a length of the eddy current array probe, and wherein at least a portion of the eddy current channels comprise inclined orientations with respect to the conductive bus to enable the eddy current array probe to detect flaws having a length greater than a size of each of the eddy current channels.

2. The eddy current array probe of claim 1, wherein the plurality of eddy current channels comprises a first eddy current channel oriented at a first angle with respect to the conductive bus and a second eddy current channel oriented at a second angle with respect to the conductive bus, wherein the first angle and the second angle cause the first eddy current channel and the second eddy current channel to be substantially perpendicular to each other.

3. The eddy current array probe of claim 2, wherein two eddy current channels of the plurality of eddy channels are configured to generate complementary signals in response to a secondary magnetic field generated by an eddy current formed in a test specimen, wherein the complementary signals are configured to enhance detection of flaws in any orientation, and wherein the two eddy current channels are disposed in different rows.

4. The eddy current array probe of claim 2, wherein the first and second eddy current channels partially overlap in the first direction.

5. The eddy current array probe of claim 1, wherein the drive coil of each eddy current channel is disposed about the first and second sensing coils.

6. The eddy current array probe of claim 1, wherein the first and second sensing coils are each square, rectangular, triangular, circular, semi-circular or any combination thereof.

* * * * *